(12) United States Patent
Tsai et al.

(10) Patent No.: US 9,230,911 B2
(45) Date of Patent: Jan. 5, 2016

(54) INTERCONNECT STRUCTURE AND METHOD OF FORMING THE SAME

(71) Applicant: Taiwan Semiconductor Manufacturing Company, Ltd., Hsin-Chu (TW)

(72) Inventors: Cheng-Hsiung Tsai, Zhunan Township (TW); Chung-Ju Lee, Hsin-Chu (TW); Hai-Ching Chen, Hsin-Chu (TW); Tien-I Bao, Dayuan Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/144,245

(22) Filed: Dec. 30, 2013

(65) Prior Publication Data

US 2015/0187696 A1    Jul. 2, 2015

(51) Int. Cl.
*H01L 21/4763* (2006.01)
*H01L 29/40* (2006.01)
*H01L 23/528* (2006.01)
*H01L 21/768* (2006.01)
*H01L 23/532* (2006.01)
*H01L 23/498* (2006.01)
*H01L 23/522* (2006.01)

(52) U.S. Cl.
CPC .......... *H01L 23/528* (2013.01); *H01L 21/7682* (2013.01); *H01L 21/76832* (2013.01); *H01L 21/76835* (2013.01); *H01L 21/76852* (2013.01); *H01L 21/76885* (2013.01); *H01L 23/49822* (2013.01); *H01L 23/5222* (2013.01); *H01L 23/5329* (2013.01); *H01L 23/53209* (2013.01); *H01L 23/53295* (2013.01); *H01L 23/53223* (2013.01); *H01L 23/53238* (2013.01); *H01L 23/53252* (2013.01); *H01L 2924/0002* (2013.01)

(58) Field of Classification Search
CPC ............ H01L 21/764; H01L 21/76837; H01L 23/528
USPC .......................................... 438/619; 257/760
See application file for complete search history.

(56) References Cited

U.S. PATENT DOCUMENTS

| | | | |
|---|---|---|---|
| 2001/0016412 A1* | 8/2001 | Lee et al. | 438/622 |
| 2005/0074961 A1* | 4/2005 | Beyer et al. | 438/619 |
| 2006/0088975 A1 | 4/2006 | Ueda | |
| 2009/0093100 A1 | 4/2009 | Xia et al. | |
| 2009/0263951 A1 | 10/2009 | Shibata et al. | |
| 2010/0001409 A1* | 1/2010 | Humbert et al. | 257/774 |
| 2013/0020706 A1* | 1/2013 | Furuhashi et al. | 257/741 |

FOREIGN PATENT DOCUMENTS

DE      102008026134 A1    12/2009

* cited by examiner

*Primary Examiner* — Caridad Everhart
(74) *Attorney, Agent, or Firm* — Slater & Matsil, L.L.P.

(57) ABSTRACT

An interconnect structure and a method of forming an interconnect structure are disclosed. The interconnect structure includes a low-k (LK) dielectric layer over a substrate; a first conductive feature and a second conductive feature in the LK dielectric layer; a first spacer along a first sidewall of the first conductive feature; a second spacer along a second sidewall of the second conductive feature, wherein the second sidewall of the second conductive feature faces the first sidewall of the first conductive feature; an air gap between the first spacer and the second spacer; and a third conductive feature over the first conductive feature, wherein the third conductive feature is connected to the first conductive feature.

20 Claims, 4 Drawing Sheets

INTERCONNECT STRUCTURE AND METHOD OF FORMING THE SAME

BACKGROUND

The fabrication of integrated chips can be broadly separated into two main sections, front-end-of-the-line (FEOL) fabrication and back-end-of-the-line (BEOL) fabrication. FEOL fabrication includes the formation of devices (e.g., transistors, capacitors, resistors, etc.) within a semiconductor substrate. BEOL fabrication includes the formation of one or more metal interconnect layers comprised within one or more insulating dielectric layers disposed above the semiconductor substrate. The metal interconnect layers of the BEOL electrically connect individual devices of the FEOL to external pins of an integrated chip.

As the size of a semiconductor device size decreases, the capacitive coupling between the metal interconnect layers of the BEOL tends to increase since the capacitive coupling is inversely proportional to the distance between the metal interconnect layers. This coupling may ultimately limit the speed of the chip or otherwise inhibit proper chip operation if steps are not taken to reduce the capacitive coupling. Accordingly, a need has developed in the art for an improved method of forming an interconnect structure for an integrated chip.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
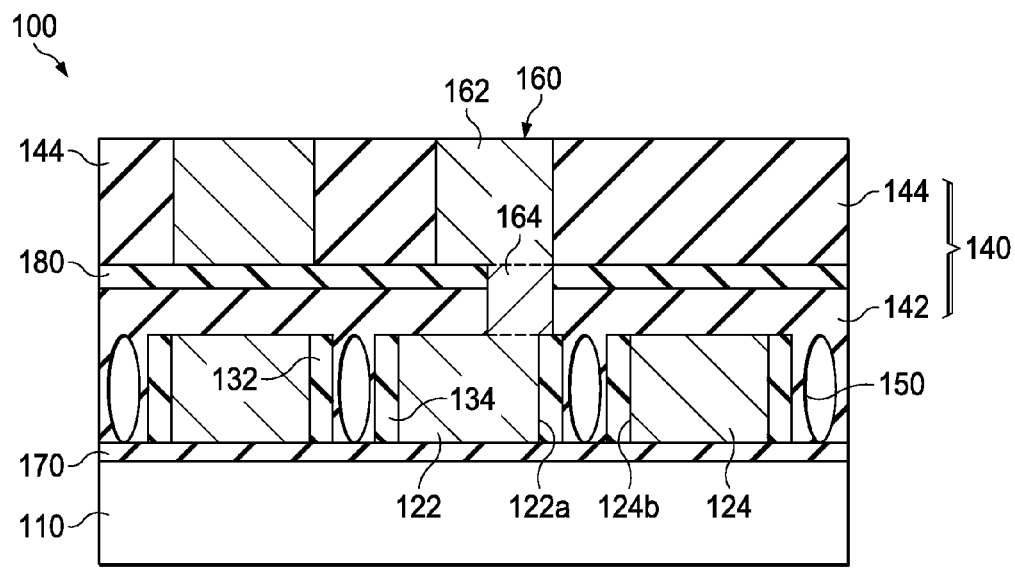
FIG. 1 is a cross-sectional view of an interconnect structure 100 according to various aspects of the present disclosure.

The present disclosure relates generally to semiconductor structures, and more particularly, to methods of forming an air gap-containing interconnect structure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "under", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter. It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

There is a need for new methods that provide low RC time constants for advanced semiconductor devices, wherein "R" is the resistance of the on-chip wiring and "C" is the effective capacitance between the signal lines and the surrounding conductors in the multilevel interconnection stack. RC time constants are reduced by lowering the specific resistance of the wiring material, and by using dielectrics with lower dielectric constants, k. Traditional semiconductor fabrication commonly employs silicon dioxide ($SiO_2$) as a dielectric, which has a k of approximately 3.9. Implementation of organic materials to reduce k also reduces the overall BEOL capacitance. Instead of using $SiO_2$ and organic materials, another approach is to implement an air gap or a void, which is provided in the form of an air gap-containing interconnect structure. Even a small air gap near the wire results in a significant improvement in the overall k for a structure, e.g., a 10% air gap per edge will reduce the effective k of a dielectric by approximately 15%.

FIG. 1 is a cross-sectional view of an interconnect structure 100 according to various aspects of the present disclosure. As depicted in FIG. 1, the interconnect structure 100 comprises low-k (LK) dielectric layer 140 over a substrate 110; a first conductive feature 122 and a second conductive feature 124 in the LK dielectric layer 140; a first spacer 132 along a first sidewall 122a of the first conductive feature 122, wherein the first spacer 132 has a substantially rectangular shape; a second spacer 134 along a second sidewall 124b of the second conductive feature 124, wherein the second sidewall 124b of the second conductive feature 124 faces the first sidewall 122a of the first conductive feature 122, and wherein the second spacer 134 has a substantially rectangular shape; an air gap 150 between the first spacer 132 and the second spacer 134; and a third conductive feature 160 over the first conductive feature 122, wherein the third conductive feature 160 is connected to the first conductive feature 122. The interconnect structure 100 may further comprise an upper etch stop layer (ESL) 180 between a first portion 142 and a second portion 144 of the LK dielectric layer 140. The interconnect structure 100 may further comprise a lower etch stop layer (ESL) 170 between the LK dielectric layer 140 and the substrate 110.

A dielectric material of the LK dielectric layer 140 comprises an oxide, $SiO_2$, SiOCH, borophosphosilicate glass (BPSG), tetraethyl orthosilicate (TEOS), undoped silicate glass (USG), fluorinated silicate glass (FSG), high-density plasma (HDP) oxide, plasma-enhanced TEOS (PETEOS), fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. In some embodiments, k is between about 1.5 and about 2.8. The LK dielectric layer 140 may be formed by atomic layer deposition (ALD), chemical vapor deposition (CVD), physical vapor deposition (PVD), or combinations thereof.

The substrate 110 may be a semiconductor substrate that includes an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate 110 may be a semiconductor on insulator (SOI). In some examples, the substrate 110 may include a doped epi layer. In other examples, the substrate 110 may include a multilayer compound semiconductor structure. Alternatively, the substrate 110 may include a non-semiconductor material, such as a glass, fused quartz, or calcium fluoride. In some embodiments, the substrate 110 comprises a lower LK dielectric layer.

The first conductive feature 122, the second conductive feature 124, or the third conductive feature 160 comprises copper (Cu), aluminum (Al), silver (Ag), gold (Au), or alloys thereof. The first conductive feature 122, the second conductive feature 124, or the third conductive feature 160 may comprise one or more barrier layers selected from a group of W, WN, Ti, Al, TiAl, TiN, TiAlN, Ta, TaC, TaN, TaCN, TaSiN, Mn, Zr, Nb, or Ru. The first conductive feature 122, the second conductive feature 124, or the third conductive feature 160 may also comprise one or more cap layers having a composition of the formula $M_xO_yN_z$, where M is a metal, O is oxygen, and N is nitrogen. Generally, the metal is selected from the group consisting of Al, Mn, Co, Ti, Ta, W, Ni, Sn, Mg, and combinations thereof. The first conductive feature 122, the second conductive feature 124, or the third conductive feature 160 may be formed by a process including, but not limited to, ALD, CVD, PVD, sputtering, plating, or combinations thereof.

In some embodiments, the first conductive structure 122 is a first metal line, the second conductive structure 124 is a second metal line, and the third conductive structure 160 comprises a third metal line 162 and a via 164 contiguous with the third metal line 162. As depicted in FIG. 1, the third conductive feature 160 is connected to the first conductive feature 122. In some embodiments, the third conductive feature 160 is spaced away from the air gap 150. In some embodiments, the third conductive feature 160 is further connected to the first spacer 132. The first spacer 132 is configured to act as a stop layer or a buffer structure to prevent the third conductive feature 160 from extending through the air gap 150, so there is no need to provide an additional mask to avoid the via 164 punch through concern.

In some embodiments, an aspect ratio is a height of the first spacer 132 or the second spacer 134 divided by a spacing between the first spacer 132 and the second spacer 134, the aspect ratio being greater than or equal to about 2. The aspect ratio is well controlled so as to form the air gap 150 between the first spacer 132 and the second spacer 134. For example, the aspect ratio is from about 2 to about 5. For another example, the aspect ratio is from about 2.5 to about 3.5.

In some embodiments, the first spacer 132 or the second spacer 134 comprises a metal compound. In some embodiments, the metal compound comprises a metal oxide, a metal nitride, a metal carbide, a metal boride, or a combination of two or more thereof. In some embodiments, the metal compound comprises one or more metal elements selected from ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), or silver (Ag). The first spacer 132 or the second spacer 134 may be formed using a suitable process such as ALD, CVD, PVD, molecular beam epitaxy (MBE), spin-on, or combinations thereof. In some embodiments, the first spacer 132 or the second spacer 134 has a thickness in a range from about 50 angstroms (Å) to about 80 angstroms (Å). In other embodiments, the first spacer 132 or the second spacer 134 has a thickness in a range from about 60 Å to about 70 Å.

As depicted above, the first spacer 132 and the second spacer 134 have a substantially rectangular shape. In some embodiments, a top surface of the first spacer 132 and a lateral surface of the first spacer 132 intersect at a first corner point to form an angle of about 90 degrees, and the first corner point does not need to touch the top surface or the lateral surface of the first spacer 132. Note that in practice the first corner point has a slight rounding rather than a sharp point. Similarly, a top surface of the second spacer 134 and a lateral surface of the second spacer 134 intersect at a second corner point to form an angle of about 90 degrees, while the second corner point does not need to touch the top surface or the lateral surface of the second spacer 134. Note that in practice the second corner point has a slight rounding rather than a sharp point.

In some embodiments, the air gap 150 is associated with a k=1. Accordingly, the air gap 150 of the interconnect structure 100 facilitates improved RC performance with respect to a gap associated with a k higher than 1, for example. However, gap materials other than air are contemplated. In some embodiments, the air gap 150 has a width in a range from about 1 Å to about 100 Å.

In some embodiments, the interconnect structure 100 further comprises an upper ESL 180 between a first portion 142 and a second portion 144 of the LK dielectric layer 140. The upper ESL 180 is extended through by the third conductive structure 160. For example, the upper ESL 180 is under the third metal line 162 and extended through by the via 164. In some embodiments, the interconnect structure 100 further comprises a lower ESL 170 between the LK dielectric layer 140 and the substrate 110. The material for the lower ESL 170 or the upper ESL 180 includes SiO, SiC, SiN, SiOC, SiON, SiCN, TiN, AlN, AlON, TEOS, hard black diamond (HBD), or the like. Alternatively, the lower ESL 170 or the upper ESL 180 may be formed by depositing and annealing a metal oxide material, which includes hafnium (Hf), hafnium oxide (HfO2), or aluminum (Al). The lower ESL 170 or the upper ESL 180 may be formed using a suitable process such as ALD, CVD, PVD, MBE, spin-on, or combinations thereof. In some embodiments, the lower ESL 170 or the upper ESL 180 has a thickness in a range from about 10 Å to about 300 Å.

The interconnect structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 2:
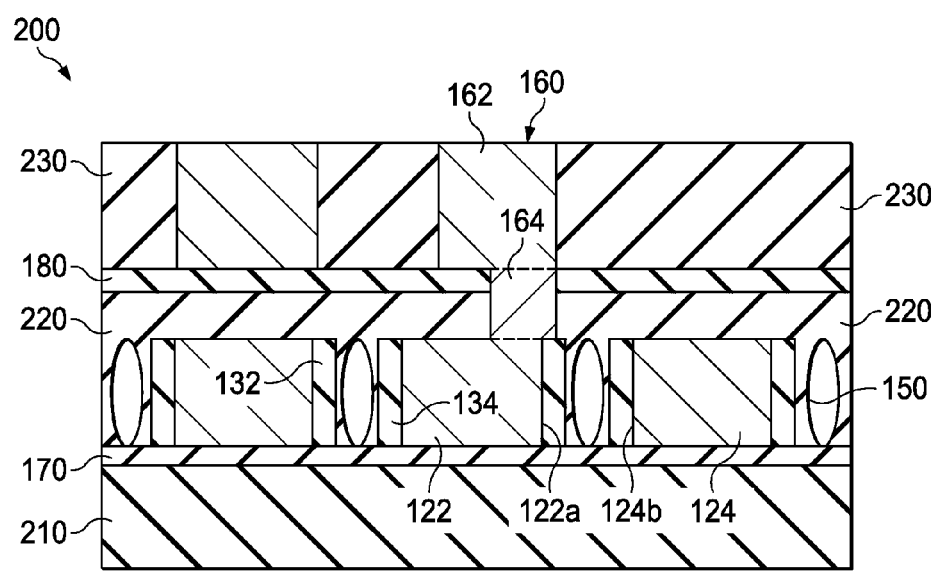
FIG. 2 is a cross-sectional view of an interconnect structure 200 according to various aspects of the present disclosure.

FIG. 2 is a cross-sectional view of an interconnect structure 200 according to various aspects of the present disclosure. FIG. 2 is similar to FIG. 1 except that: the substrate 110 in FIG. 1 is replaced by a lower low-k (LK) dielectric layer 210 in FIG. 2, the first portion 142 of the LK dielectric layer 140 in FIG. 1 is replaced by a middle LK dielectric layer 220 in FIG. 2, and the second portion 144 of the LK dielectric layer 140 in FIG. 1 is replaced by an upper LK dielectric layer 230 in FIG. 2. As depicted in FIG. 2, the interconnect structure 200 comprises a lower low-k (LK) dielectric layer 210; a middle LK dielectric layer 220 over the lower LK dielectric layer 210; a first conductive feature 122 and a second conductive feature 124 in the middle LK dielectric layer 220; a first spacer 132 along a first sidewall 122a of the first conductive feature 122, wherein the first spacer 132 has a substantially rectangular shape; a second spacer 134 along a second sidewall 124b of the second conductive feature 124, wherein the second sidewall 124b of the second conductive feature 124 faces the first sidewall 122a of the first conductive feature 122, and wherein the second spacer 134 has a substantially rectangular shape; an air gap 150 in the middle LK dielectric layer 220 between the first spacer 132 and the second spacer 134 in the middle LK dielectric layer 220; an upper LK dielectric layer 230 over the middle LK dielectric layer 220; and a third conductive feature 160 over the first conductive feature 122, wherein the third conductive feature 160 is connected to the first conductive feature 122 and spaced away from the air gap 150. The interconnect structure 200 may further comprise a lower etch stop layer (ESL) 170 between the lower LK dielectric layer 210 and the middle LK dielectric layer 220; or an upper ESL 180 between the middle LK dielectric layer 220 and the upper LK dielectric layer 230.

A dielectric material of the lower LK dielectric layer 210, the middle LK dielectric layer 220, or the upper LK dielectric layer 230 comprises an oxide, SiO2, SiOCH, BPSG, TEOS, USG, FSG, HDP oxide, PETEOS, fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. In some embodiments, k is between about 1.5 and about 2.8. The lower LK dielectric layer 210, the middle LK dielectric layer 220, or the upper LK dielectric layer 230 may be formed by ALD, CVD, PVD, or combinations thereof.

Figure 3:
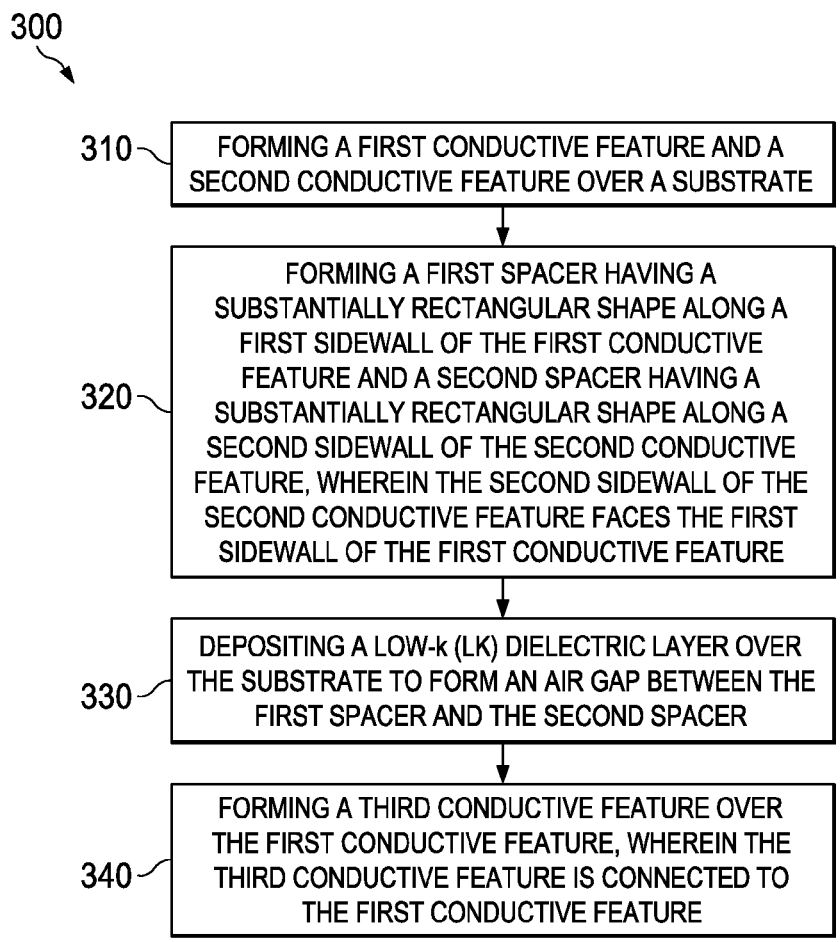
FIG. 3 is a flowchart of a method 300 of forming the interconnect structure 100 according to various aspects of the present disclosure.

FIG. 3 is a flowchart of a method 300 of forming the interconnect structure 100 according to various aspects of the present disclosure. It is understood that additional steps can be provided before, during, and after the method 300, and some of the steps described can be replaced or eliminated for other embodiments of the method 300. The method 300 begins at step 310 in which a first conductive feature 122 and a second conductive feature 124 are formed over a substrate 110. The method 300 continues with step 320 in which a first spacer 132 having a substantially rectangular shape is formed along a first sidewall 122a of the first conductive feature 122 and a second spacer 134 having a substantially rectangular shape is formed along a second sidewall 124b of the second conductive feature 124, wherein the second sidewall 124b of the second conductive feature 124 faces the first sidewall 122a of the first conductive feature 122. The method 300 continues with step 330 in which a low-k (LK) dielectric layer 140 is deposited over the substrate 110 to form an air gap 150 between the first spacer 132 and the second spacer 134. The method 300 continues with step 340 in which a third conductive feature 160 is formed over the first conductive feature 122, wherein the third conductive feature 160 is connected to the first conductive feature 122. A lower etch stop layer (ESL) 170 may be further formed between the LK dielectric layer 140 and the substrate 110. An upper ESL 180 may be further formed between a first portion 142 and a second portion 144 of the LK dielectric layer 140. The discussion that follows illustrates embodiments of the interconnect structure 100 that can be fabricated according to the method 300 of FIG. 3.

Figure 4:
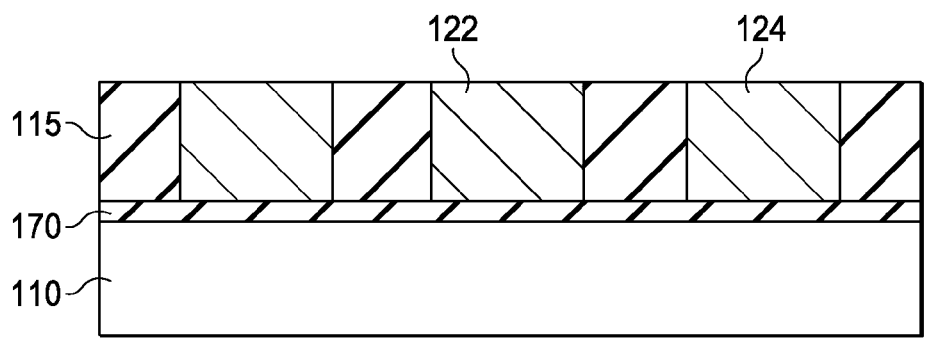
FIGS. 4-8 are cross-sectional views of the interconnect structure 100 at various stages of fabrication according to various aspects of the present disclosure.
Figure 5:
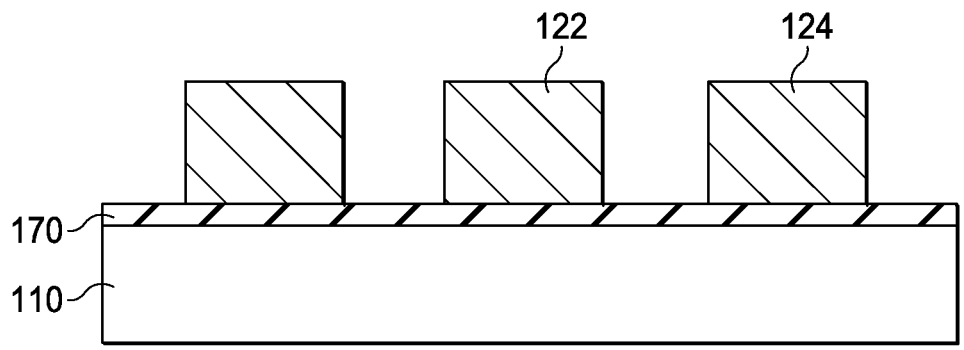

FIGS. 4-8 are cross-sectional views of the interconnect structure 100 at various stages of fabrication according to various aspects of the present disclosure. As depicted in FIG. 4, FIG. 5, and step 310 in FIG. 3, the method 300 begins at step 310 by forming a first conductive feature 122 and a second conductive feature 124 over a substrate 110. The step 310 comprises: forming a dielectric layer 115 over the substrate 110; forming the first conductive feature 122 and the second conductive feature 124 in the dielectric layer 115; and removing the dielectric layer 115. The substrate 110 may be a semiconductor substrate that includes an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate 110 may be a semiconductor on insulator (SOI). In some examples, the substrate 110 may include a doped epi layer. In other examples, the substrate 110 may include a multilayer compound semiconductor structure. Alternatively, the substrate 110 may include a non-semiconductor material, such as a glass, fused quartz, or calcium fluoride. In some embodiments, the substrate 110 comprises a LK dielectric layer.

The first conductive feature 122 or the second conductive feature 124 may be formed by a process including, but not limited to, ALD, CVD, PVD, sputtering, plating, or combinations thereof. The first conductive feature 122 or the second conductive feature 124 comprises Cu, Al, Ag, Au, or alloys thereof. The first conductive feature 122 or the second conductive feature 124 may comprise one or more barrier layers selected from a group of W, WN, Ti, Al, TiAl, TiN, TiAlN, Ta, TaC, TaN, TaCN, TaSiN, Mn, Zr, Nb, or Ru. The first conductive feature 122 or the second conductive feature 124 may also comprise one or more cap layers having a composition of the formula $M_xO_yN_z$, where M is a metal, O is oxygen, and N is nitrogen. Generally, the metal is selected from the group consisting of Al, Mn, Co, Ti, Ta, W, Ni, Sn, Mg, and combinations thereof. In some embodiments, the first conductive structure 122 is a first metal line, and the second conductive structure 124 is a second metal line.

Figure 9:
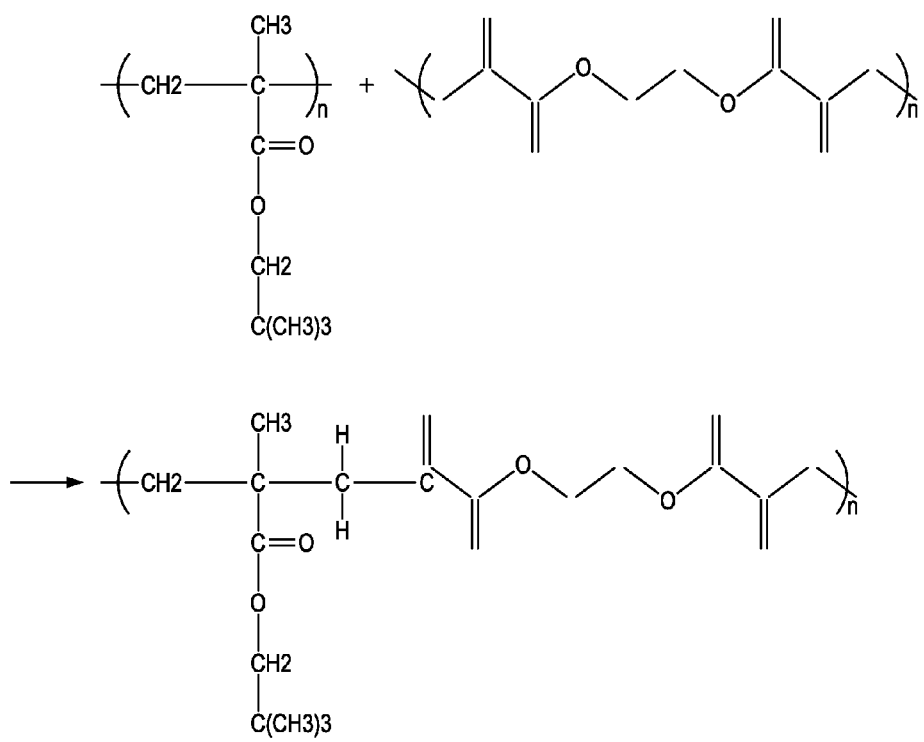
FIG. 9 shows one example of the polymerization processes of P(npMAco-EGDA).

The dielectric layer 115 may be formed by ALD, CVD, PVD, spin-on, or combinations thereof. In some embodiments, the dielectric layer 115 comprises an oxide, SiO2, SiOCH, BPSG, TEOS, USG, FSG, HDP oxide, PETEOS, fluorine-doped silicon oxide, carbon-doped silicon oxide, porous silicon oxide, porous carbon-doped silicon oxide, organic polymers, or silicone based polymers. In other embodiments, the dielectric layer 115 comprises a LK dielectric material or a thermally decomposable material. The LK dielectric material is associated with a dielectric constant (k) less than 3.9. For example, k is between about 1.5 and about 2.8. The thermally decomposable material comprises Poly (neopentyl methacrylate-co-ethylene glycol dimethacrylate) copolymer which is abbreviated as P(npMAco-EGDA). FIG. 9 shows one example of the polymerization processes of P(npMAco-EGDA).

In some embodiments, the removing dielectric layer 115 comprises using an etching process or a thermal treatment. The etching process such as a dry etching process or a wet etching process is used to remove the LK dielectric material. The dry etching process may be a single step or a multiple step etching process. The dry etching process may be an anisotropic etching process. The dry etching process may use reactive ion etch (RIE) and/or other suitable process. In one example, a dry etching process is used to etch the LK dielectric material that includes a chemistry including fluorine-containing gas. The wet etching process may use a chemical including fluorine-containing species and metal inhibitors. The thermal treatment such as an ultraviolet (UV) curing process is used to remove the thermally decomposable material. For example, the UV curing process is performed at about 400° C. to 450° C. for about 30 minutes to 1 hour so that C—H or C—O bond in P(npMAco-EGDA) can be decomposed.

Figure 6:
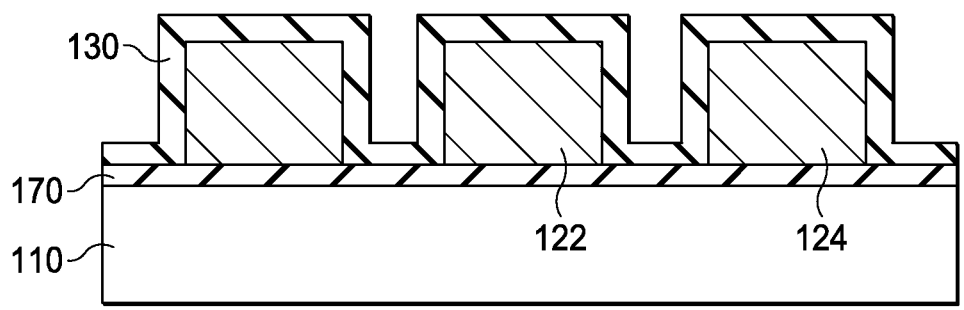
Figure 7:
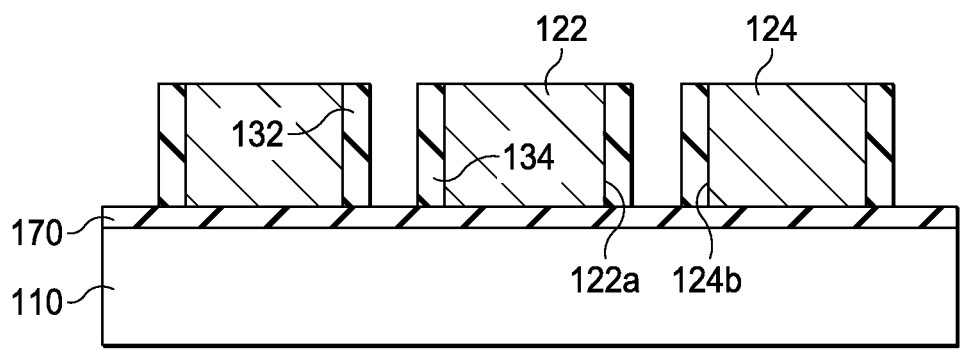

As depicted in FIG. 6, FIG. 7, and step 320 in FIG. 3, the method 300 continues with step 320 by forming a first spacer 132 having a substantially rectangular shape along a first sidewall 122a of the first conductive feature 122 and a second spacer 134 having a substantially rectangular shape along a second sidewall 124b of the second conductive feature 124, wherein the second sidewall 124b of the second conductive feature 124 faces the first sidewall 122a of the first conductive feature 122. The step 320 comprises forming a spacer layer 130 conformally over the first conductive feature 122, the second conductive feature 124, and the substrate 110; and removing horizontal portions of the spacer layer 130 to form the first spacer 132 and the second spacer 134. The spacer layer 130 may be formed using a suitable process such as ALD, CVD, PVD, MBE, spin-on, or combinations thereof. For example, the range of the deposition condition is as follows: temperature is from about 100° C. to about 400° C., pressure is from about 0.1 torr to about 50 torr, and power is from about 10 watts to about 100 watts. The composition of the spacer layer 130 can also be selected to provide an etch stop layer for use during further process. In some embodiments, the spacer layer 130 comprises a metal compound. In some embodiments, the metal compound comprises a metal oxide, a metal nitride, a metal carbide, a metal boride, or a combination of two or more thereof. In some embodiments, the metal compound comprises one or more metal elements selected from Ru, Ni, Co, Cr, Fe, Mn, Ti, Al, Hf, Ta, W, V, Mo, Pd, or Ag. In some embodiments, the spacer layer 130 has a thickness in a range from about 50 Å to about 80 Å. In other embodiments, the spacer layer 130 has a thickness in a range from about 60 Å to about 70 Å. In some embodiments, the removing horizontal portions of the spacer layer 130 is performed by an anisotropic etch process (e.g., dry etching) so that vertical portions of the spacer layer 130 can be left. The vertical portions include the first spacer 132 and the second spacer 134.

Figure 8:
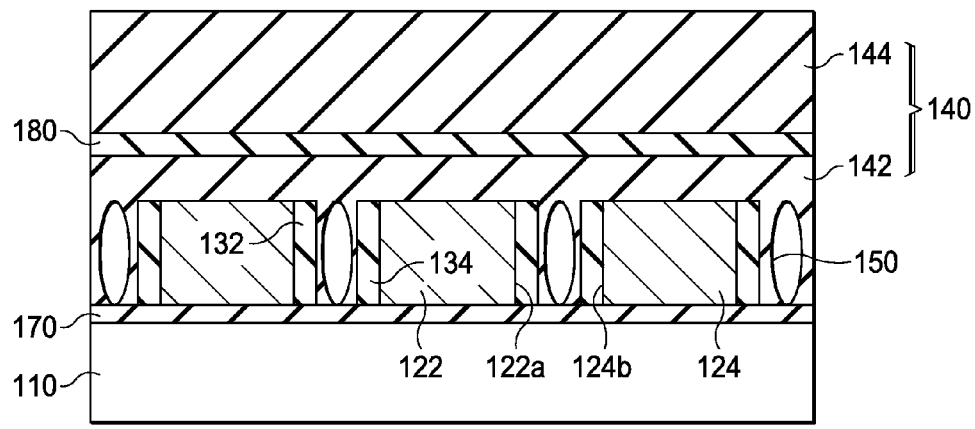

As depicted in FIG. 8 and step 330 in FIG. 3, the method 300 continues with step 330 by depositing a low-k (LK) dielectric layer 140 over the substrate 110 to form an air gap 150 between the first spacer 132 and the second spacer 134. The LK dielectric layer 140 may be formed by ALD, CVD, PVD, or combinations thereof. A dielectric material of the LK dielectric layer 140 comprises an oxide, SiO2, SiOCH, BPSG, TEOS, USG, FSG, HDP oxide, PETEOS, fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. For example, k is between about 1.5 and about 2.8. In some embodiments, an aspect ratio is a height of the first spacer 132 or the second spacer 134 divided by a spacing between the first spacer 132 and the second spacer 134, the aspect ratio being greater than or equal to about 2. The aspect ratio is well controlled so as to form the air gap 150 between the first spacer 132 and the second spacer 134. For example, the aspect ratio is from about 2 to about 5. For another example, the aspect ratio is from about 2.5 to about 3.5. In some embodiments, the air gap 150 is associated with a k=1. Accordingly, the air gap 150 of the interconnect structure 100 facilitates improved RC performance with respect to a gap associated with a k higher than 1, for example. However, gap materials other than air are contemplated. In some embodiments, the air gap 150 has a width in a range from about 1 Å to about 100 Å.

As depicted in FIG. 1 and step 340 in FIG. 3, the method 300 continues with step 340 by forming a third conductive feature 160 over the first conductive feature 122, wherein the third conductive feature 160 is connected to the first conductive feature 122. The third conductive feature 160 may be formed by a process including, but not limited to, ALD, CVD, PVD, sputtering, plating, or combinations thereof. The third conductive feature 160 comprises Cu, Al, Ag, Au, or alloys thereof. The third conductive feature 160 may comprise one or more barrier layers selected from a group of W, WN, Ti, Al, TiAl, TiN, TiAlN, Ta, TaC, TaN, TaCN, TaSiN, Mn, Zr, Nb, or Ru. The third conductive feature 160 may also comprise one or more cap layers having a composition of the formula MxOyNz, where M is a metal, O is oxygen, and N is nitrogen. Generally, the metal is selected from the group consisting of Al, Mn, Co, Ti, Ta, W, Ni, Sn, Mg, and combinations thereof. In some embodiments, the third conductive structure 160 comprises a third metal line 162 and a via 164 contiguous with the third metal line 162. The via 164 is connected to the first conductive feature 122. In some embodiments, the third conductive feature 160 is spaced away from the air gap 150. In some embodiments, the third conductive feature 160 is further connected to the first spacer 132. The first spacer 132 is configured to act as a stop layer or a buffer structure to prevent the third conductive feature 160 from extending through the air gap 150, so there is no need to provide an additional mask to avoid the via 164 punch through concern.

As depicted in FIG. 1, in some embodiments, the method 300 further comprises forming a lower etch stop layer (ESL) 170 between the LK dielectric layer 140 and the substrate 110; or forming an upper ESL 180 between a first portion 142 and a second portion 144 of the LK dielectric layer 140. The lower ESL 170 or the upper ESL 180 may be formed using a suitable process such as ALD, CVD, PVD, MBE, spin-on, or combinations thereof. The material for the lower ESL 170 or the upper ESL 180 includes SiO, SiC, SiN, SiOC, SiON, SiCN, TiN, AlN, AlON, TEOS, hard black diamond (HBD), or the like. Alternatively, the lower ESL 170 or the upper ESL 180 may be formed by depositing and annealing a metal oxide material, which includes hafnium (Hf), hafnium oxide (HfO2), or aluminum (Al). In some embodiments, the lower ESL 170 or the upper ESL 180 has a thickness in a range from about 10 Å to about 300 Å. The upper ESL 180 is extended through by the third conductive structure 160. For example, the upper ESL 180 is under the third metal line 162 and extended through by the via 164.

The methods of the present disclosure are not limited to be used by a planar device on the substrate and can be applied to a non-planar device as well, such as a fin-like field effect transistor (FinFET) or a nanowire device. Based on the discussions above, it can be seen that by using the methods of the present disclosure, the dielectric constant (k) of the LK dielectric material is reduced by forming an air gap between a first spacer and a second spacer. The first spacer is along a first sidewall of a first conductive feature, the second spacer is along a second sidewall of a second conductive feature, and the second sidewall of the second conductive feature faces the first sidewall of the first conductive feature. When the air gap is formed, the first spacer is configured to act as a stop layer or a buffer structure to prevent a third conductive feature from extending through the air gap, so there is no need to provide an additional mask to avoid via punch through concern. As a result, the RC performance of the device can be well controlled by using the methods of the present disclosure.

One of the broader forms of the present disclosure involves an interconnect structure. The interconnect structure comprises a low-k (LK) dielectric layer over a substrate; a first conductive feature and a second conductive feature in the LK dielectric layer; a first spacer along a first sidewall of the first conductive feature, wherein the first spacer has a substantially rectangular shape; a second spacer along a second sidewall of the second conductive feature, wherein the second sidewall of the second conductive feature faces the first sidewall of the first conductive feature, and wherein the second spacer has a substantially rectangular shape; an air gap between the first spacer and the second spacer; and a third conductive feature over the first conductive feature, wherein the third conductive feature is connected to the first conductive feature.

Another of the broader forms of the present disclosure involves an interconnect structure. The interconnect structure comprises a lower low-k (LK) dielectric layer; a middle LK dielectric layer over the lower LK dielectric layer; a first conductive feature and a second conductive feature in the middle LK dielectric layer; a first spacer along a first sidewall of the first conductive feature, wherein the first spacer has a substantially rectangular shape; a second spacer along a second sidewall of the second conductive feature, wherein the second sidewall of the second conductive feature faces the first sidewall of the first conductive feature, and wherein the second spacer has a substantially rectangular shape; an air gap in the middle LK dielectric layer between the first spacer and the second spacer in the middle LK dielectric layer; an upper LK dielectric layer over the middle LK dielectric layer; and a third conductive feature over the first conductive feature, wherein the third conductive feature is connected to the first conductive feature and spaced away from the air gap.

Still another of the broader forms of the present disclosure involves a method of forming an interconnect structure. The method comprises forming a first conductive feature and a second conductive feature over a substrate; forming a first spacer having a substantially rectangular shape along a first sidewall of the first conductive feature and a second spacer having a substantially rectangular shape along a second sidewall of the second conductive feature, wherein the second sidewall of the second conductive feature faces the first sidewall of the first conductive feature; depositing a low-k (LK) dielectric layer over the substrate to form an air gap between the first spacer and the second spacer; and forming a third conductive feature over the first conductive feature, wherein the third conductive feature is connected to the first conductive feature.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An interconnect structure, comprising:
   a first low-k (LK) dielectric layer;
   a second LK dielectric layer over the first LK dielectric layer;
   a first conductive feature and a second conductive feature in the second LK dielectric layer;
   a first spacer along a first sidewall of the first conductive feature;
   a second spacer along a second sidewall of the second conductive feature, wherein the second sidewall of the second conductive feature faces the first sidewall of the first conductive feature;
   an air gap between the first spacer and the second spacer, wherein the second LK dielectric layer extends at least in part between the first spacer and the air gap, between the second spacer and the air gap, or both; and
   a third conductive feature over the first conductive feature, wherein the third conductive feature is connected to the first conductive feature.

2. The interconnect structure of claim 1, wherein the first LK dielectric layer and the second LK dielectric layer comprise a same material.

3. The interconnect structure of claim 1, wherein an aspect ratio is a height of the first spacer or the second spacer divided by a spacing between the first spacer and the second spacer, the aspect ratio being greater than or equal to about 2.

4. The interconnect structure of claim 1, wherein the first spacer or the second spacer has a thickness in a range from about 50 angstroms (Å) to about 80 angstroms (Å).

5. The interconnect structure of claim 1, wherein the third conductive feature is spaced away from the air gap.

6. The interconnect structure of claim 1, wherein the third conductive feature is further connected to the first spacer.

7. The interconnect structure of claim 1, wherein:
   the first conductive feature is a first metal line;
   the second conductive feature is a second metal line; and
   the third conductive feature comprises a third metal line and a via contiguous with the third metal line.

8. The interconnect structure of claim 1, further comprising a second etch stop layer (ESL) between a first portion and a second portion of the second LK dielectric layer.

9. The interconnect structure of claim 1, further comprising a first etch stop layer (ESL) between the first LK dielectric layer and the second LK dielectric layer.

10. The interconnect structure of claim 1, wherein the first spacer or the second spacer comprises a metal compound.

11. The interconnect structure of claim 10, wherein the metal compound comprises a metal oxide, a metal nitride, a metal carbide, a metal boride, or a combination of two or more thereof.

12. An interconnect structure, comprising:
a first low-k (LK) dielectric layer;
a second LK dielectric layer over the first LK dielectric layer;
a first conductive feature and a second conductive feature in the second LK dielectric layer;
a first spacer along a first sidewall of the first conductive feature;
a second spacer along a second sidewall of the second conductive feature, wherein the second sidewall of the second conductive feature faces the first sidewall of the first conductive feature, wherein the first spacer or the second spacer has a thickness greater than or equal to about 50 angstroms (Å);
an air gap in the second LK dielectric layer between the first spacer and the second spacer;
a third LK dielectric layer over the second LK dielectric layer; and
a third conductive feature over the first conductive feature, wherein the third conductive feature is connected to the first conductive feature and spaced away from the air gap.

13. The interconnect structure of claim 12, wherein an aspect ratio is a height of the first spacer or the second spacer divided by a spacing between the first spacer and the second spacer, the aspect ratio being greater than or equal to about 2.

14. The interconnect structure of claim 12, wherein the first spacer or the second spacer comprises a metal compound selected from a metal oxide, a metal nitride, a metal carbide, a metal boride, or a combination of two or more thereof.

15. The interconnect structure of claim 12, wherein the first spacer or the second spacer has a thickness in a range from about 50 angstroms (Å) to about 80 angstroms (Å).

16. The interconnect structure of claim 12, further comprising at least one of:
a first etch stop layer (ESL) between the first LK dielectric layer and the second LK dielectric layer; or
an second ESL between the second LK dielectric layer and the third LK dielectric layer.

17. A method of forming an interconnect structure, comprising:
forming a first conductive feature and a second conductive feature over a first low-k (LK) dielectric layer;
forming a first spacer along a first sidewall of the first conductive feature and a second spacer along a second sidewall of the second conductive feature, wherein the second sidewall of the second conductive feature faces the first sidewall of the first conductive feature;
depositing a second LK dielectric layer over the first LK dielectric layer to form an air gap between the first spacer and the second spacer, wherein the second LK dielectric layer extends at least in part between the first spacer and the air gap, between the second spacer and the air gap, or both; and
forming a third conductive feature over the first conductive feature, wherein the third conductive feature is connected to the first conductive feature.

18. The method of claim 17, wherein the step of forming a first spacer along a first sidewall of the first conductive feature and a second spacer along a second sidewall of the second conductive feature comprises:
forming a spacer layer conformally over the first conductive feature, the second conductive feature, and the first LK dielectric layer; and
removing horizontal portions of the spacer layer to form the first spacer and the second spacer.

19. The method of claim 18, further comprising:
forming a first etch stop layer (ESL) between the second LK dielectric layer and the first LK dielectric layer.

20. The method of claim 18, further comprising:
forming a second etch stop layer (ESL) between a first portion and a second portion of the second LK dielectric layer.

* * * * *